United States Patent [19]

Chikahisa et al.

[11] Patent Number: 5,479,854
[45] Date of Patent: Jan. 2, 1996

[54] AUTOMATIC SQUEEGEE ANGLE AND PRESSURE ADJUSTING MEANS

[75] Inventors: Naoichi Chikahisa, Kofu; Ken Takahashi, Yamanashi; Takao Naito, Yamanashi; Takashi Sasaki, Yamanashi, all of Japan

[73] Assignee: Matsushita Electric Industrial Co., Ltd., Osaka, Japan

[21] Appl. No.: 356,969

[22] Filed: Dec. 16, 1994

[30] Foreign Application Priority Data

Dec. 16, 1993 [JP] Japan ................... 5-315685

[51] Int. Cl.⁶ .......................... B41F 15/46
[52] U.S. Cl. .............. 101/123; 101/484; 118/413; 427/9
[58] Field of Search ................. 101/114, 120, 101/123, 124, 129, 483, 484; 118/413, 713; 427/8, 9, 10

[56] References Cited

U.S. PATENT DOCUMENTS 4,893,556  1/1990  Takahashi et al. ................. 101/123

FOREIGN PATENT DOCUMENTS

2901830  8/1979  Germany ................. 101/129
46249    3/1985  Japan ................. 101/123
114649   5/1988  Japan ................. 101/123
5-193104 8/1993  Japan .

Primary Examiner—Stephen Funk
Attorney, Agent, or Firm—Wenderoth, Lind & Ponack

[57] ABSTRACT

A screen printing machine in which a squeegee is driven to form a film of solder on a board through a screen, includes an automatic squeegeeing angle setter which includes a squeegeeing angle adjuster for adjusting a squeegeeing angle of the squeegee and a squeegeeing angle detector for detecting the angle thereof to set the squeegeeing angle of the squeegee by the squeegeeing angle adjuster based on a detection of the squeegeeing angle detector, an automatic pressing amount setter which includes a squeegee pressing amount adjuster for adjusting a squeegee pressing amount caused by the squeegee and a squeegee pressing force detector for detecting a squeegee pressing force to set the pressing amount in consideration of a change in height resulting from a change of the angle of the squeegee by the squeegee pressing amount adjuster based on a detection of the squeegee pressing force detector, and an automatic balancing amount setter which includes a pressing amount balance adjuster for adjusting a balance of the pressing amount of the squeegee to set the balance of the pressing amount of the squeegee by the pressing amount balance adjuster based on a detection of the pressing force detector.

2 Claims, 9 Drawing Sheets

Fig. 11 PRIOR ART $\alpha 2 > \alpha 1$

AUTOMATIC SQUEEGEE ANGLE AND PRESSURE ADJUSTING MEANS

BACKGROUND OF THE INVENTION

The present invention relates to a screen printing machine wherein a film of solder is formed on a board by moving a squeegee via a screen.

It is a recent pressing demand to enhance the accuracy of a screen printing machine because more and more higher-density and higher-quality circuit boards are required. It is also increasingly demanded for the screen printing machine to be ready to switch the printing mode, rise and start immediately after the maintenance work, with exerting conveniences of manipulation. By way of example, there is disclosed a screen printing machine in Japanese Laid-Open Patent Publication No.5-193104 (193104/1993) which is adapted to automatically control the printing thickness. The prior art machine changes a squeegeeing angle in accordance with the output data from a pulse motor and a displacement sensor measuring the printing film thickness, thereby maintaining a target film thickness.

Figure 8:
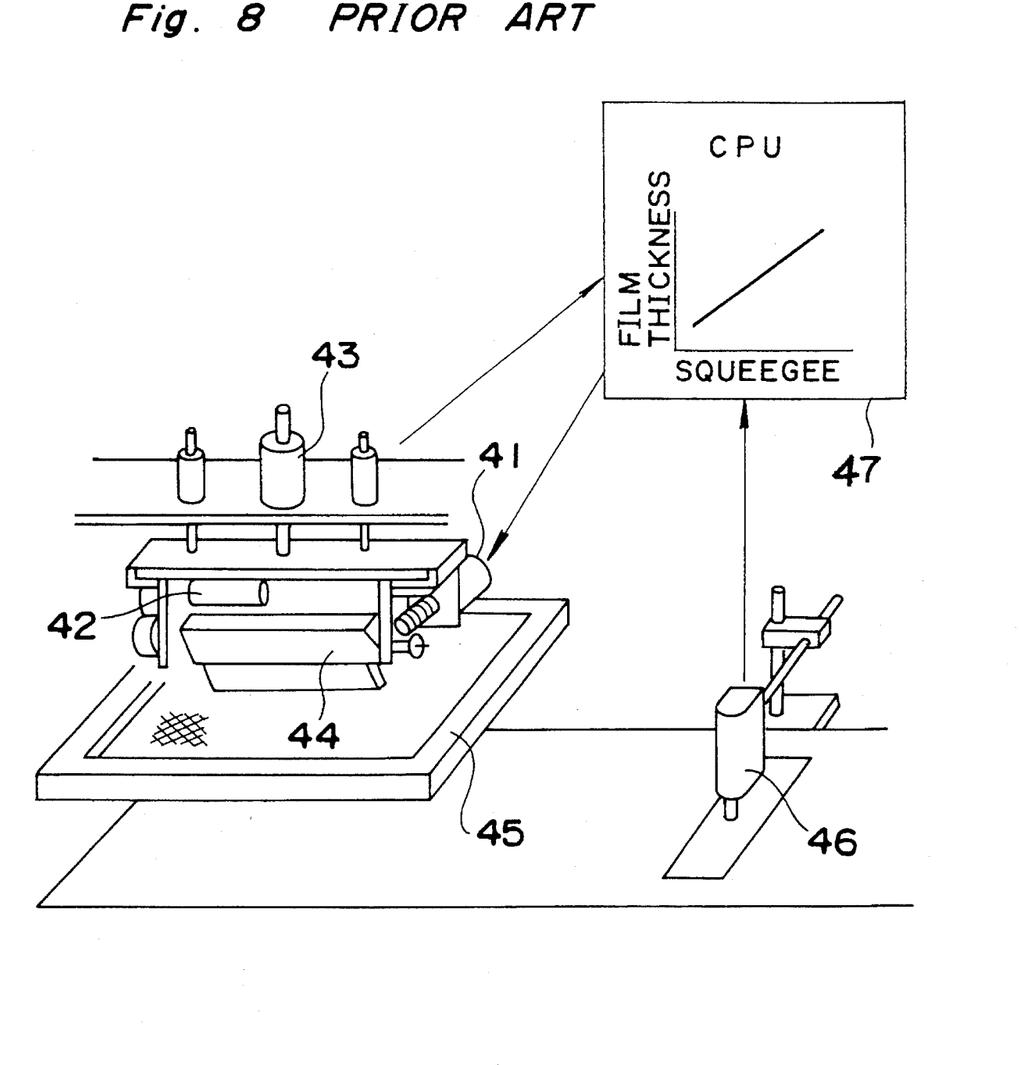
FIG. 8 is a perspective view of a conventional screen printing machine.

A conventional screen printing machine of the type referred to above, that is, which automatically controls the film thickness will be depicted with reference to the corresponding drawings. Referring to FIG. 8, element 41 is a pulse motor; element 42 is an encoder; element 43 is an air cylinder; element 44 is a squeegee; element 45 is a screen; element 46 is a displacement sensor; and element 47 is a CPU.

Figure 9:
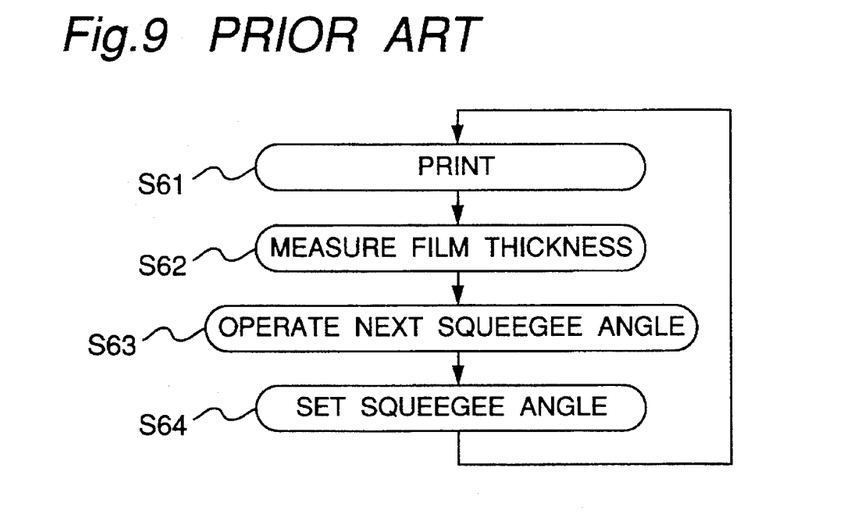
FIG. 9 is a flowchart of the operation of the conventional screen printing machine of FIG. 8.
Figure 10:
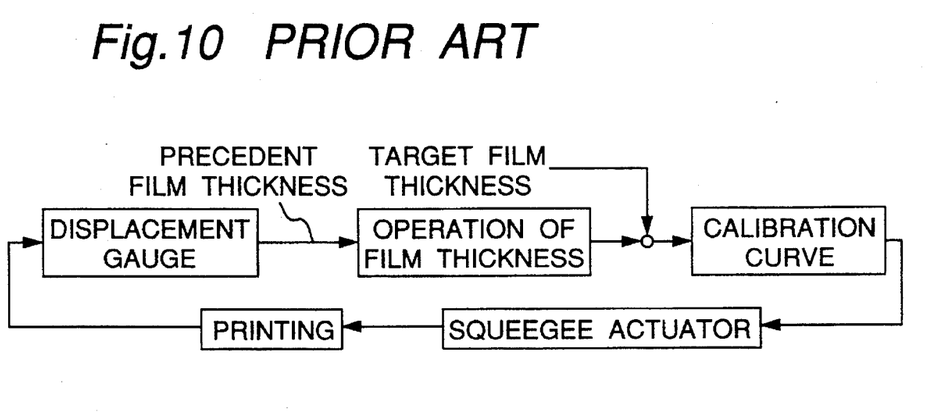
FIG. 10 is a diagram showing the process of the operation of the conventional screen printing machine of FIG. 8.

The screen printing machine comprising the above components operates in the following manner. As indicated in the flowchart of FIGS. 9 and 10, first, at step S61 cream solder is printed by the squeegee 44 and the air cylinder 43 which maintains the pressing pressure by the squeegee 44 constant. The thickness of the printed cream solder is detected by the displacement sensor 46 at step S62. When the measuring result is output to the CPU 47, the CPU 47 uses a difference of the measured thickness between the thickness of the printed cream solder and a target film thickness as a to-be-fed back angle for the squeegee, whereby the pulse motor 41 and the encoder 42 are variably controlled to obtain the target film thickness at steps S63 and S64. It is to be noted here that the CPU 47 operates the film thickness as proportional to the angle of the squeegee, as shown in FIG. 8.

Figure 11:
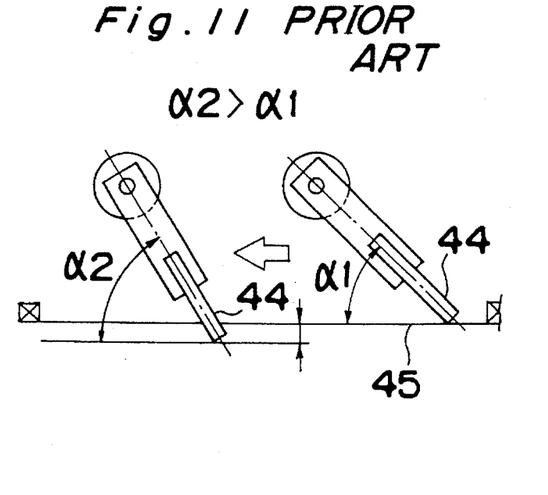
FIGS. 11, 12, 13, and 14 are explanatory diagrams of problems inherent in the conventional screen printing machine, specifically, FIGS. 11 and 12 being side views of a squeegee and FIGS. 13 and 14 being front views of the squeegee.

In the constitution of the conventional screen printing machine as above, as understood from FIG. 11, even when the angle of the squeegee 44 is increased from α1 to α2 so as to attain a larger rolling angle, the pressing amount to the screen 45 is so much as to wipe the cream solder off, resulting in the reduced film thickness.

Figure 12:
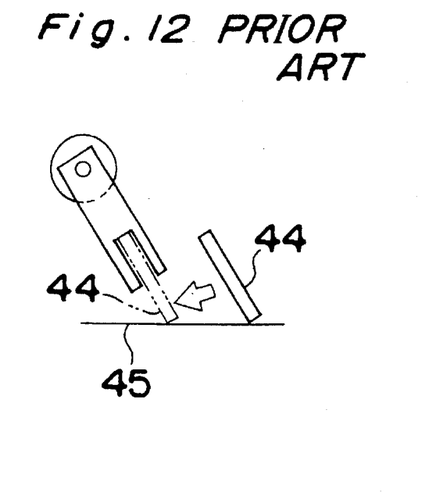
Figure 13:
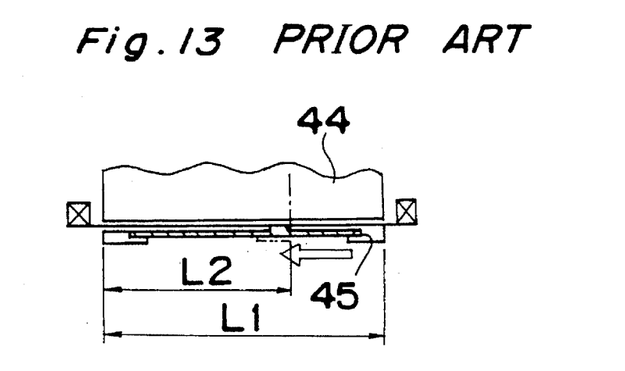
Figure 14:
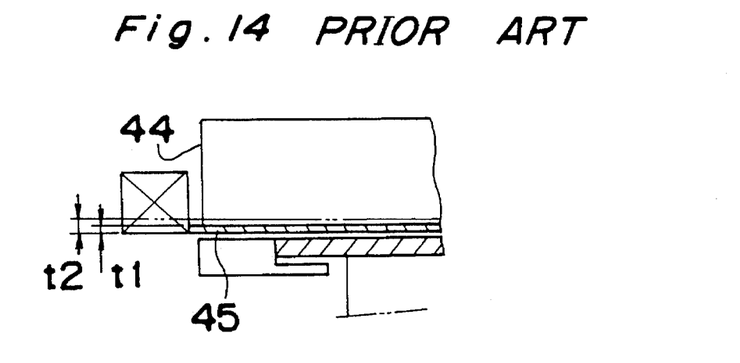

FIGS. 12, 13, and 14 respectively illustrate cases when the squeegee 44 is changed, when the squeegeeing length is changed from L1 to L2 and when the screen thickness is changed from t1 to t2, or vice versa. It is impossible in any of the arrangements in FIGS. 12–14 to control the film thickness to be optimum merely by keeping the squeegeeing angle constant so as to thereby maintain the optimum rolling angle. Moreover, the prior art machine cannot adjust the film thickness for such a squeegee, e.g., a sword-shaped squeegee or a prism squeegee that is pressed in touch with the screen 45 approximately at right angles and not inclined to the screen 45.

SUMMARY OF THE INVENTION

The object of the present invention is therefore to provide a screen printing machine which can obtain the optimum film thickness without changing the optimum rolling angle while maintaining the squeegeeing angle constant even to a sword-shaped squeegee, a prism squeegee or the like squeegee not inclined to the screen.

In accomplishing these and other objects, according to one aspect of the present invention, there is provided a screen printing machine for driving a squeegee to form a film of solder on a board through a screen, the screen printing machine comprising:

an automatic squeegeeing angle setting means which includes a squeegeeing angle adjusting means for adjusting a squeegeeing angle of the squeegee and a squeegeeing angle detecting means for detecting the angle thereof to set the squeegeeing angle of the squeegee by the squeegeeing angle adjusting means based on a detection of the squeegeeing angle detecting means;

an automatic pressing amount setting means which includes a squeegee pressing amount adjusting means for adjusting a squeegee pressing amount caused by the squeegee and a squeegee pressing force detecting means for detecting a squeegee pressing force to set the pressing amount in consideration of a change in height resulting from change of the angle of the squeegee by the squeegee pressing amount adjusting means based on a detection of the squeegee pressing force detecting means; and an automatic balancing amount setting means which includes a pressing amount balance adjusting means for adjusting a balance of the pressing amount of the squeegee to set the balance of the pressing amount of the squeegee by the pressing amount balance adjusting means based on a detection of the pressing force detecting means.

Not only the squeegeeing angle, but the pressing force and the balancing force before and after pressing by the squeegee are adjusted in the above-depicted constitution of the screen printing machine of the present invention. Therefore, while the optimum squeegeeing angle to obtain a large rolling angle is maintained, or the sword-shaped or prism squeegee can be held at 90° to the screen, the printing machine can set the optimum pressing amount in the shortest time, thereby performing printing easily and quickly under the optimum conditions, for instance, when the kind of to-be-printed objects is changed or the machine starts to operate after maintenance work.

Moreover, when the printing state recognizing means for recognizing the printing state is provided, the machine of the invention can automatically correct the printing state based on the recognized data and with no manual inputs required.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

Preferred embodiments of a screen printing machine of the present invention will be described hereinbelow with reference to the accompanying drawings.

Figure 1:
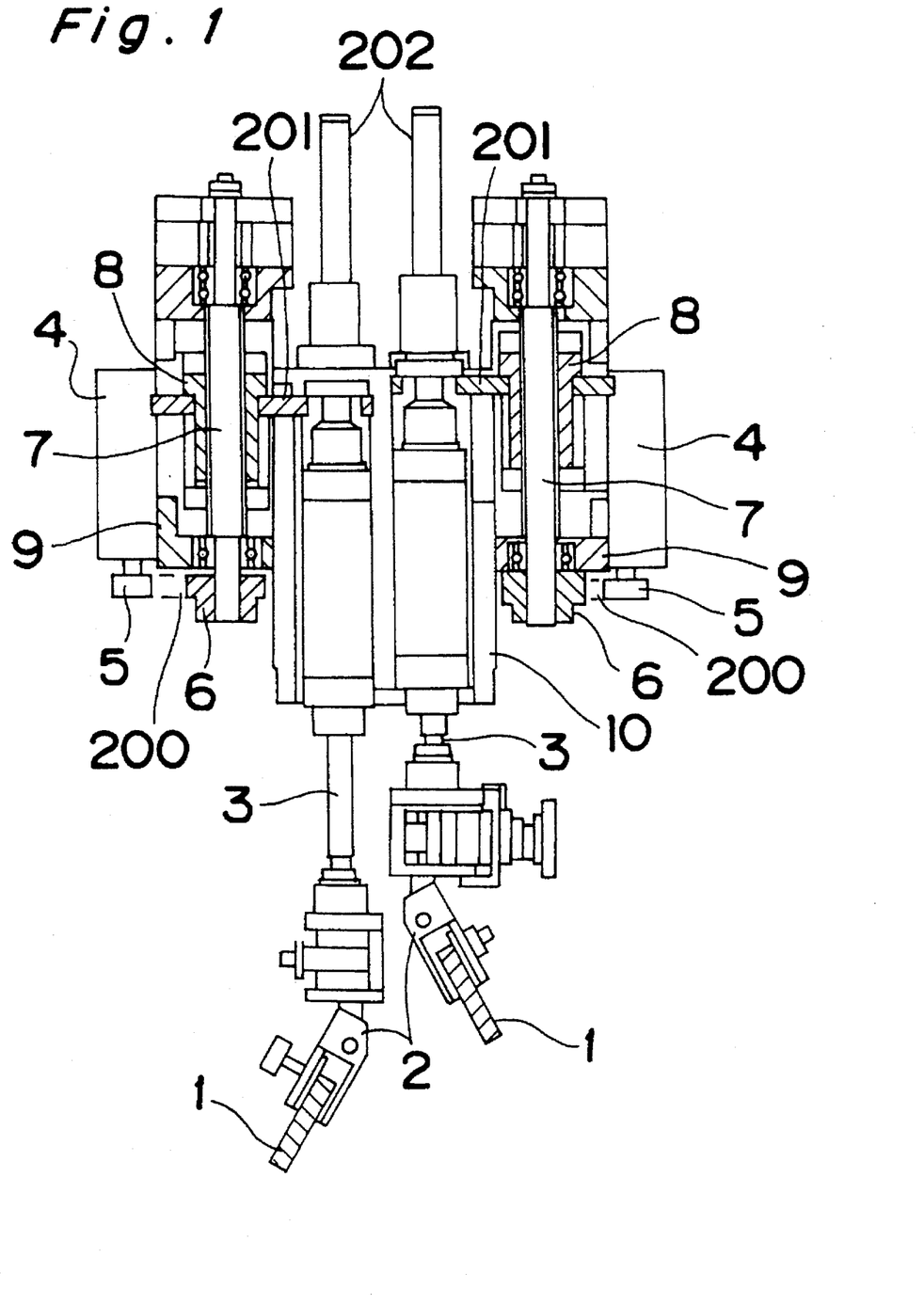
FIG. 1 is a partially sectional front view of a screen printing machine (a view taken along the line I—I of FIG. 2) according to a first embodiment of the present invention.

FIG. 1 shows a screen printing machine according to an embodiment of the present invention which has right and left pressing amount adjusting means for adjusting the pressing amount by each squeegee 1. For simplification, the description is made with respect to the left pressing amount adjusting means.

In FIG. 1, element 1 is a left squeegee; element 2 is a left squeegee holder for holding the squeegee 1; element 3 is a left squeegee lift cylinder for lifting the squeegee holder 2; element 4 is a pulse motor to press the left squeegee 1; element 5 is a pulley at the side of the left pulse motor 4 which is rotated by the motor 4; element 6 is a pulley at the side of a left ball screw 7 which is connected to the pulley 5 at the side of the left pulse motor 4 through a belt 200; element 7 is the left ball screw connected to the pulley 6 at the side of the left ball screw 7; element 8 is a left ball screw nut which is screwed onto the ball screw 7; and element 9 is a left bracket supporting the ball screw 7 and the motor 4 etc. to a robot frame 10 described later. The lifting operation of the squeegee 1 by the cylinder 3 is guided by two guide rods 202. The cylinder 3 is connected to the ball screw nut 8 via a bracket 201. The ball screw 7 can be reversibly rotated by the motor 4 via the pulleys 5 and 6 and the belt 200 to move the ball screw nut 8 downwardly or upwardly together with the cylinder 3 via the bracket 201 while being guided by the two guide rods 202 for the downward and upward movement of the squeegee 1.

The pressing amount adjusting means for adjusting the pressing amount by the left squeegee 1 consists of the pulse motor 4, pulleys 5 and 6, left ball screw 7, and left ball screw nut 8, etc.

Figure 2:
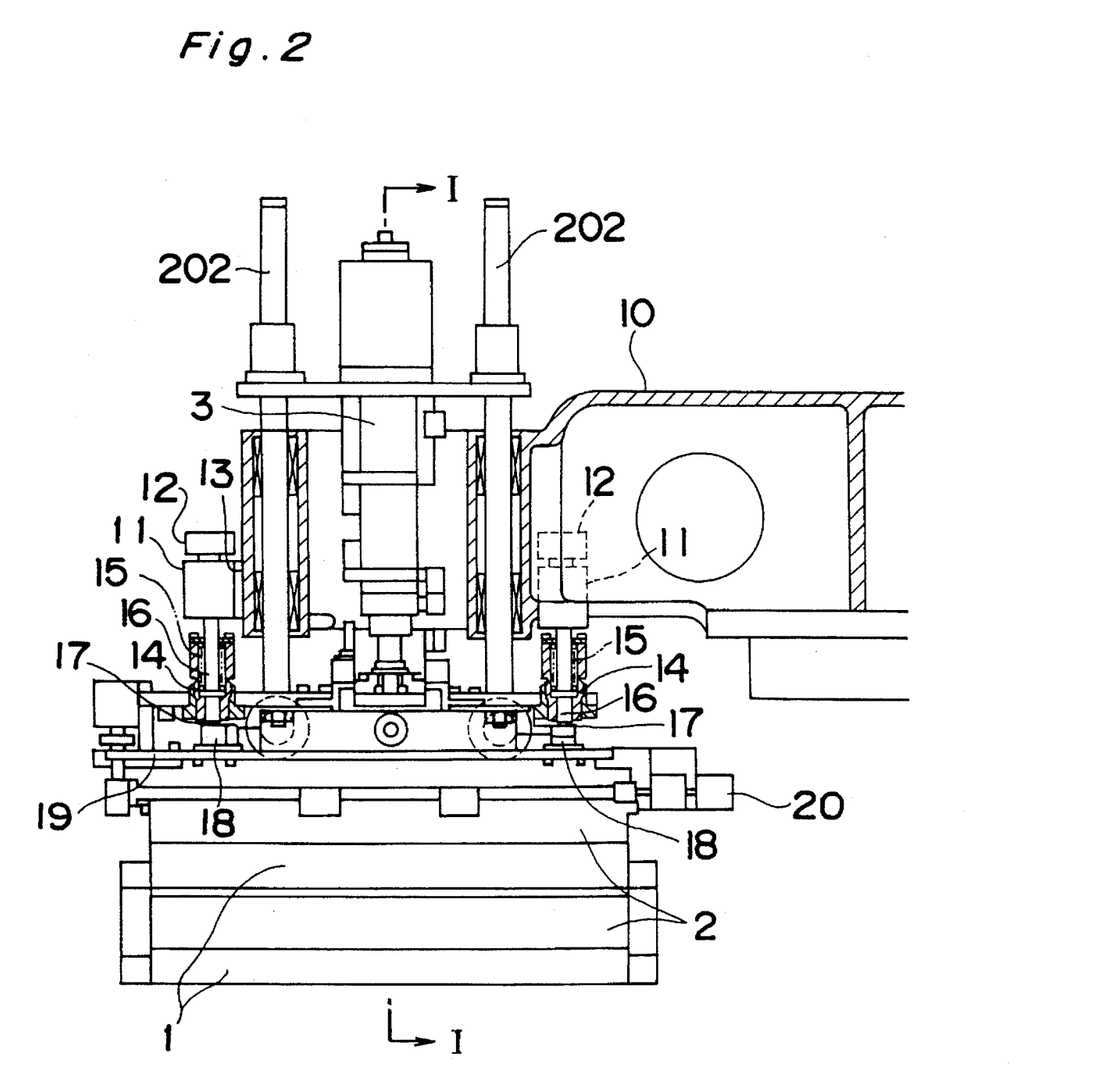
FIG. 2 is a partially sectional side view of the screen printing machine in FIG. 1.
Figure 3:
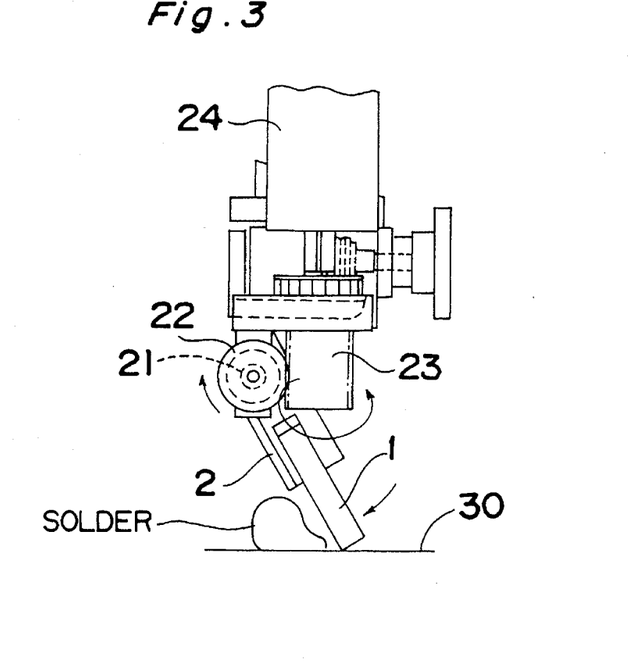
FIGS. 3 and 4 are a front view and a side view of a part of the screen printing machine in FIG. 1.
Figure 4:
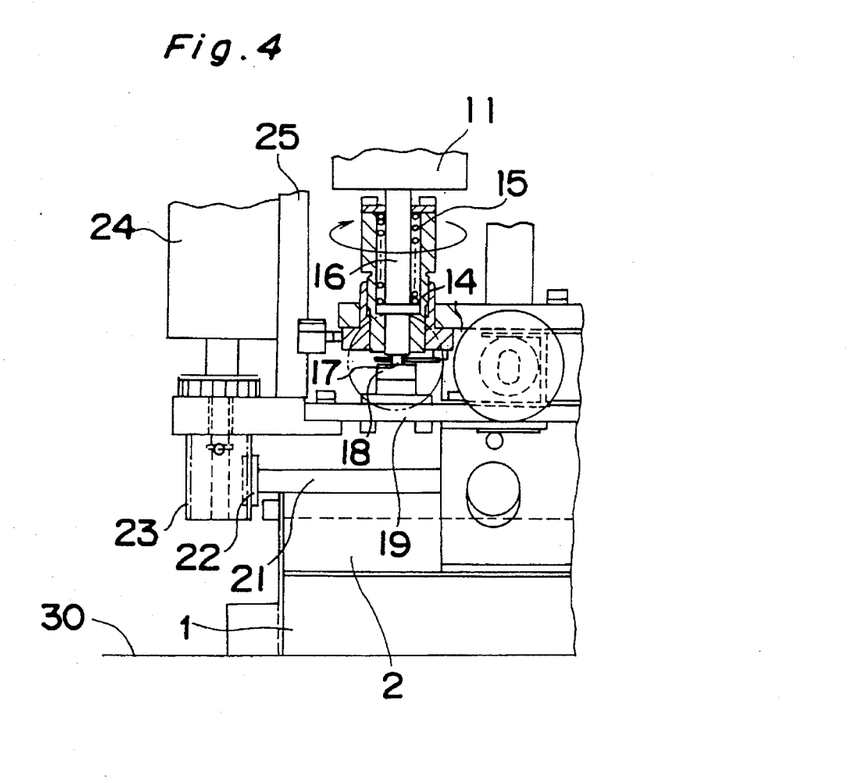

Referring now to FIGS. 2, 3, and 4, element 10 is the robot frame; element 11 is a pulse motor for adjusting the balancing force of the squeegee 1 before and after pressing of the squeegee 1; element 12 is an encoder for adjusting the pressing force of the squeegee 1; element 13 is a mounting bracket of the pulse motor 11; element 14 is an adjusting screw member for adjusting the pressing force and is rotated by the pulse motor 11; element 15 is an adjusting spring for adjusting the pressing force which is arranged in the screw member 14 to rotate therewith; element 16 is an adjusting pin for the pressing force which is arranged in the screw member 14 to rotate therewith; element 17 is an adjusting ball for the pressing force; element 18 is a detecting sensor, e.g. a strain gauge, used as a detecting means for detecting the pressing force; element 19 is a plate connected to the holder 2; element 20 is a potentiometer used as a detecting means for detecting the squeegeeing angle; element 21 is a shaft fixed to the squeegee holder 2; element 22 is a wheel fixed to the shaft 21; element 23 is a worm gear engaged with the wheel 22; element 24 is a pulse motor for adjusting the squeegeeing angle and which has the worm gear 23 and rotates the shaft 21 so as to rotate the holder 2 for adjustment of the angle of the squeegee 1; and element 25 is a mounting bracket of the pulse motor 24. An adjusting means for adjusting the angle of the left squeegee 1 is comprised of the pulse motor 24, worm gear 23, wheel 22, and shaft 21, etc. Moreover, a balance adjusting means for adjusting the balance of the pressing amount by the squeegees 1 is comprised of the pulse motor 11, adjusting screw 14, adjusting spring 15, adjusting pin 16, adjusting ball 17, and the like.

Thus, each squeegee 1 is operated by the one pressing amount adjusting means, the angle adjusting means, and the two balance adjusting means (one is used for a forward direction balance and the other is used for a backward direction balance described below).

The screen printing machine equipped with an automatic controlling function to control the printing film thickness and including the above parts operates in a manner as will be discussed hereinbelow with reference to FIGS. 1–5.

Figure 5:
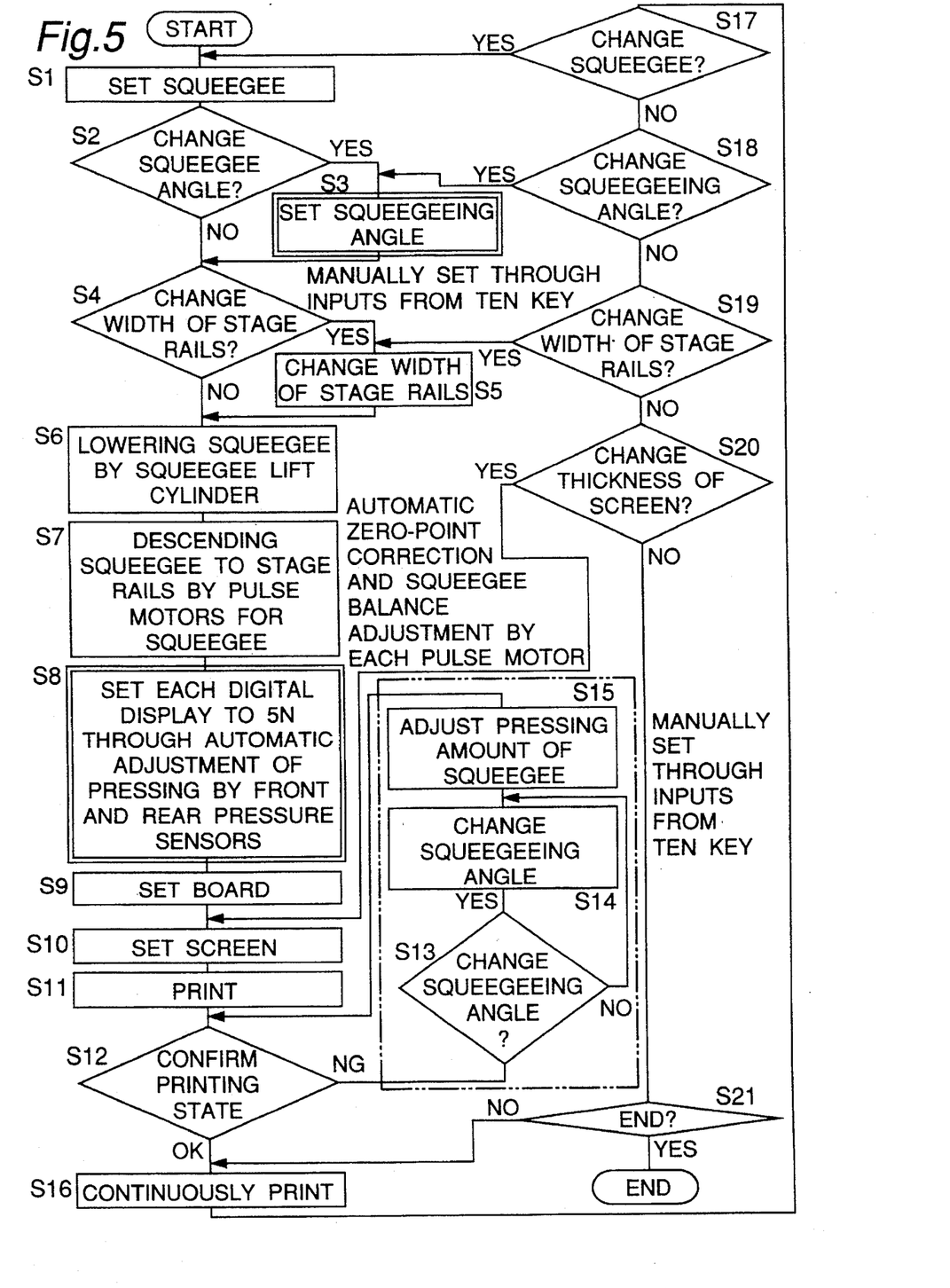
FIG. 5 is a flowchart of the operation of the screen printing machine in FIG. 1.

The left squeegee 1 is set to a left squeegee holder 2 at step S1. At step S2, when it is determined that the squeegeeing angle is to be changed, the flow gears to step S3. When it is determined that the squeegeeing angle is not to be changed at step S2, the flow goes to step S4. At step S3, a predetermined squeegeeing angle is inputted through a ten key pad on an operation panel (not shown). The relative position of the left squeegee 1 with respect to the potentiometer 20 is confirmed to get the present angle of the left squeegee 1. The angle adjusting pulse motor 24 is consequently driven by the amount of the positional difference of the squeegeeing angle and the inputted squeegeeing angle, the rotating force of which is transmitted to the worm gear 23, wheel 22, and shaft 21, thereby setting the left squeegee holder 2 at the inputted-predetermined angle at step S2.

Thereafter, at step S4, a determination is made as to whether or not the width of stage rails 50 is to be changed. When it is determined that the width of stage rails 50 is to be changed at step S4, the flow goes to step S5 wherein the width of stage rails 50 is changed and then the flow goes to step S6. When it is determined that the width of stage rails 50 is not to be changed at step S4, the flow goes to step S6. The left squeegee lift cylinder 3 is lowered to stage rails 50 set for a predetermined size of to-be-printed circuit board at step S6. The left squeegee 1 is also descended to the upper surface of the stage rails 50 by the pulse motor 4 at step S7. Then, the reaction of the squeegee 1 is automatically adjusted and balanced in the forward and backward directions (hereafter the "forward direction" is the left direction in FIG. 2 and the "backward direction" is the right direction.) by the balance adjusting pulse motor 11, thus completing a zero-point correction at step S8. At step S8, each digital display is set to a specified value, e.g.5N, through the automatic adjustment of the balance of the pressing amount by the front and rear pressure sensors (the detecting sensors 18 located in the forward and backward directions).

After a circuit board and a screen are set, printing is carried out at steps S9, S10, and S11. At step S12, a confirmation is made as to whether or not the printing condition is acceptable. When the printing condition is acceptable at step S12, the flow goes to step S16. If the printing condition is not acceptable, for example, if the printing thickness is detected to be too small or too large at step S12, the flow goes to step S13 at which a determination is mad as to whether or not the angle of the squeegee 1 is to be changed. If no at step S13, the flow goes to step S15. If yes at step S13, the squeegeeing angle is inputted at step S14 or the necessary pressing amount by the squeegee 1 is inputted through the ten key pad of the operational panel at step S15, and then the flow returns to step S11. In consequence of this, the printing machine automatically adjusts and controls the squeegeeing angle and the pressing amount to predetermined values at steps S13–S15 and, starts printing again at step S11. Then, continuous printing can be performed in this manner at step S16.

The continuous printing operation is carried out at step S16. At this time, a determination is made at steps S17–20 as to whether or not the squeegee 1 is changed, the angle of the squeegee 1 is to be changed, the width of the stage rails 50 is to be changed, and the thickness of the screen is to be changed. When it is determined that the squeegee 1 is changed at step S17, the flow goes to step S1. When it is determined that the angle of the squeegee 1 is to be changed at step S18, the flow goes to step S3. When it is determined that the width of the stage rails 50 is to be changed at step S19, the flow goes to step S5. When it is determined that the thickness of the screen is to be changed at step S20, the flow goes to step S10. When it is determined that a parameter is not to be changed at each of the steps S17–S19, the flow goes to the subsequent step. When it is determined that the thickness is not to be changed at step S20, the flow goes to step S21 where a determination is made as to whether or not the operation is to be terminated. If no at step S21, the flow goes to step S16. If yes at step S21, the flow is terminated in this manner. Even if the left squeegee 1 is exchanged for maintenance work, or subsequent to the exhaustive use thereof, or the change of the screen size, or the like reason after the continuous printing at step S16, the balance of the squeegee 1 is automatically adjusted by way of the above-described zero-point correction. Moreover, the screen printing machine is easy to manipulate and control via the ten key pad on the operation panel to respond to the change of the printing condition when the kind or model of the machine is changed.

As described hereinabove, because of the presence of the adjusting pulse motors 24, 4, and 11, the screen printing machine of the embodiment becomes able to control the pressing amount to be optimum in a short time while maintaining the optimum squeegeeing angle to obtain a large rolling angle or keeping the sword-shaped or prism squeegee at 90° to the screen. Accordingly, the target film thickness is achieved in a wide range of printing conditions.

The printing condition is inputted beforehand through the ten key pad or is stored in a memory. Although the above embodiment is discussed with respect to the left squeegee 1, needless to say, the same action and effect can be realized by the right squeegee 1 in the same manner.

A second embodiment of the present invention will be depicted with reference to the accompanying drawings, wherein parts of the same function are designated by the same reference numerals as in the first embodiment, the description of which will be abbreviated here for brevity.

Figure 6:
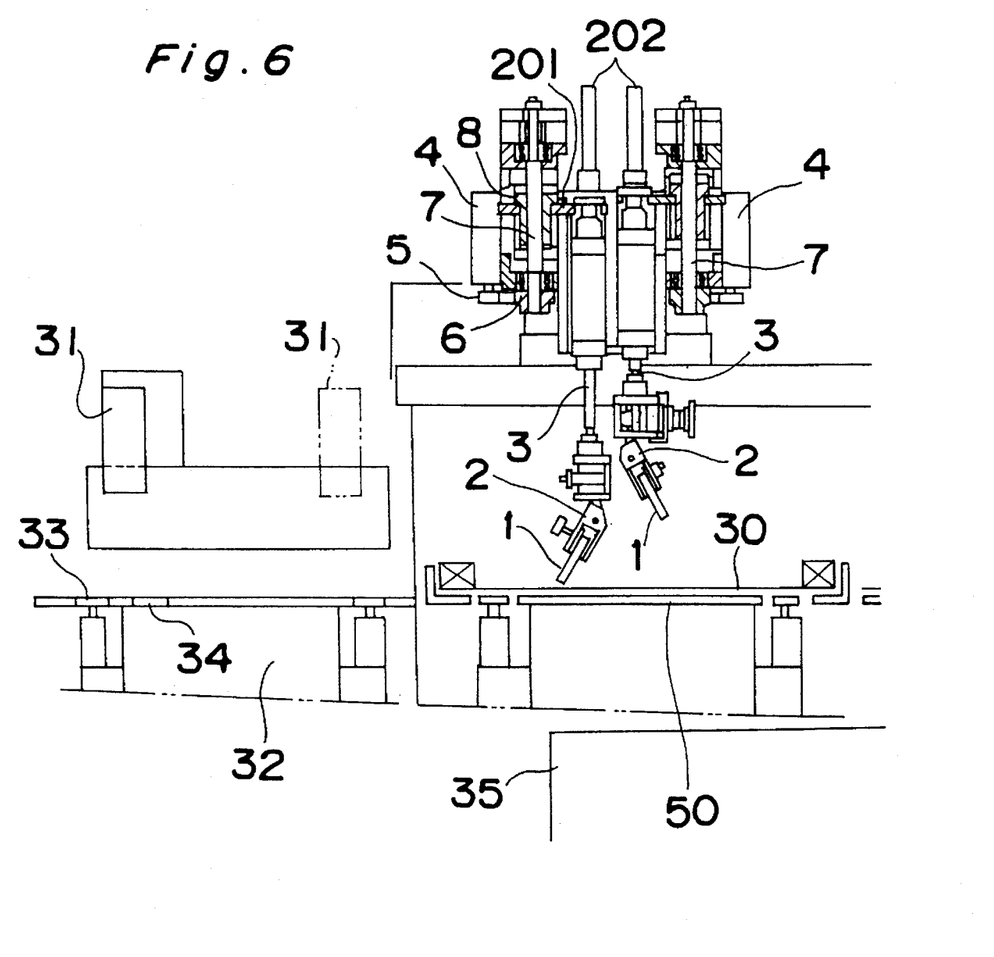
FIG. 6 is a partially sectional front view of a screen printing machine according to a second embodiment of the present invention.

FIG. 6 indicates the structure of a screen printing machine according to the second embodiment of the present invention. The second embodiment is different from the foregoing first embodiment in that printing state sensors 31 are provided in the upper part of an unloader 32 to which the circuit board is transferred. DElement 30 is a screen; element 33 is a regulator for the unloader in the X-direction; element 34 is a regulator for the unloader in the Y-direction; and element 35 is a controller for receiving a difference between the thickness of the printing film and a target film thickness and for outputting an instruction to the pulse motors 24, 4, and 11 etc. in response thereto.

Figure 7:
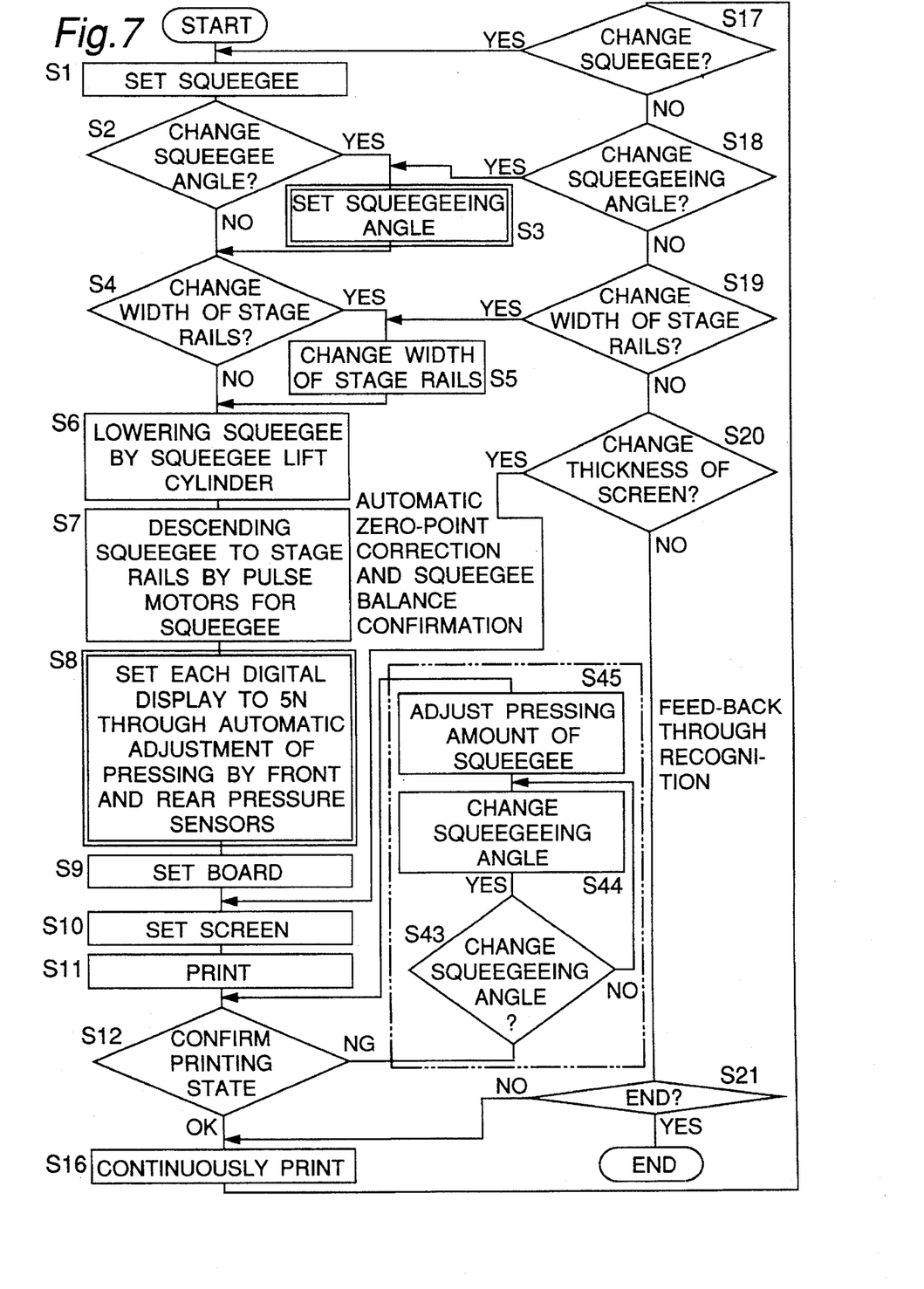
FIG. 7 is a flowchart of the operation of the screen printing machine in FIG. 6.

The operation of the screen printing machine consisting of the above parts which is adapted to automatically control the film thickness will be described with reference to FIGS. 6 and 7.

The procedure up to the zero-point correction and printing from step S1 to step S11 and from step S16 to step S21 is conducted in the same manner as in the first embodiment. However, in contrast to the first embodiment, the printing state is not confirmed by an operator in the second embodiment, but detected through the sensors 31. More specifically, the printing state sensors 31 measure the printed board regulated by the X-direction and Y-direction regulators 33 and 34, and then the controller 35 calculates a difference between thickness of the printing film on the printed board and the target printing film thickness, and feeds an instruction of the proper feedback amount to the pulse motors 24, 4, and 11 at steps S43–45.

In the manner as above, since the unloader 32 is provided with the printing state sensors 31, instead of inputting the printing state manually through the ten key pad of the operational panel as in the first embodiment, the screen printing machine of the second embodiment totally automatically confirms the printing state.

According to the present invention, not only the squeegeeing angle, but the pressing force and the pressing balance are adjusted by the squeegeeing angle adjusting means, the pressing amount adjusting means, and the balance adjusting means. Therefore, the optimum pressing amount is set in a short time while the optimum squeegeeing angle to obtain a large rolling angle is maintained or 90° is kept for the sword-like or prism squeegee. The target film thickness is easily attained in a wide range of printing conditions.

Moreover, the squeegeeing angle, the pressing force of the squeegee, and the pressing balance are detected by corresponding detecting means, so as to thereby feedback the data to the corresponding adjusting means. Therefore, even when the squeegee is exchanged during maintenance after the continuous printing, due to the exhaustive use or the change of the screen size, etc., the squeegee is automatically balanced through the zero-point correction. Besides, the machine is readily controlled through the ten key pad to the change of the printing condition when the kind of the machine is switched.

Further, the printing state sensors for recognizing the printing state makes it possible to correct the printing machine based on the recognizing data, whereby the printing state is automatically controlled.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A screen printing machine for driving a squeegee to form a film of solder on a board through a screen, the screen printing machine comprising:

an automatic squeegeeing angle setting means which includes a squeegeeing angle of the squeegee and a squeegeeing angle detecting means for detecting the angle thereof to set the squeegeeing angle of the squeegee by the squeegeeing angle adjusting means based on a detection of the squeegeeing angle detecting means;

an automatic pressing amount setting means which includes a squeegee pressing amount adjusting means for adjusting a squeegee pressing amount caused by the squeegee and a squeegee pressing force detecting means for detecting a squeegee pressing force to set the pressing amount in consideration of a change in height resulting from a change of the angle of the squeegee by the squeegee pressing amount adjusting means based on a detecting of the squeegee pressing force detecting means; and an automatic balancing amount setting means which includes a pressing amount balance adjusting means for adjusting balance of the pressing amount of the squeegee to set the balance of the pressing amount of the squeegee by the pressing amount balance adjusting means based on a detecting of the pressing force detecting means.

2. The screen printing machine as claimed in claim 1, further comprising a printing state recognizing means for recognizing a printing state of the film and for outputting instructions to the automatic squeegeeing angle setting means, automatic pressing amount setting means, and automatic balancing amount setting means based on a result of recognition of the printing state recognizing means.

* * * * *